(12) United States Patent
Weber et al.

(10) Patent No.: US 11,348,838 B2
(45) Date of Patent: May 31, 2022

(54) METHOD FOR FORMING A SUPERJUNCTION TRANSISTOR DEVICE

(71) Applicant: Infineon Technologies Austria AG, Villach (AT)

(72) Inventors: Hans Weber, Bayerisch Gmain (DE); Ingo Muri, Villach (AT); Daniel Tutuc, St. Niklas an der Drau (AT)

(73) Assignee: Infineon Technologies Austria AG, Villach (AT)

( * ) Notice: Subject to any disclaimer, the term of this patent is extended or adjusted under 35 U.S.C. 154(b) by 78 days.

(21) Appl. No.: 16/900,329

(22) Filed: Jun. 12, 2020

(65) Prior Publication Data

US 2020/0395252 A1    Dec. 17, 2020

(30) Foreign Application Priority Data

Jun. 13, 2019 (EP) .................................. 19179969

(51) Int. Cl.
*H01L 21/8234* (2006.01)
*H01L 27/088* (2006.01)

(52) U.S. Cl.
CPC ............. *H01L 21/823493* (2013.01); *H01L 21/823487* (2013.01); *H01L 27/088* (2013.01)

(58) Field of Classification Search
CPC .............................................. H01L 21/823493
See application file for complete search history.

(56) References Cited

U.S. PATENT DOCUMENTS

| | | |
|---|---|---|
| 2003/0132450 A1 | 7/2003 | Minato et al. |
| 2008/0237701 A1 | 10/2008 | Willmeroth et al. |
| 2018/0019132 A1 | 1/2018 | Mauder et al. |
| 2019/0058038 A1 | 2/2019 | Weber et al. |

OTHER PUBLICATIONS

Ahn, S. T., et al., "Enhanced Sb diffusion in Si under thermal Si3N4 films during annealing in Ar", Applied Physics Lett. 53, No. 17, Nov. 18, 1998, 1593-1595.
Miyake, Masayasu , "Oxidation-enhanced diffusion of ion-implanted boron in silicon in extrinsic conditions", XP-00819969 Journal Appl. Phys. 57 (8), Oct. 11, 1984, 1861-1868.
Ural , et al., "Fractional contributions of microscopic diffusion mechanisms for common dopants and self-diffusion in silicon", Journal of applied physics; vol. 85; No. 9, Jan. 29, 1999, 6440-6446.

*Primary Examiner* — John A Bodnar
(74) *Attorney, Agent, or Firm* — Murphy, Bilak & Homiller, PLLC

(57) ABSTRACT

A transistor device and a method for forming a transistor device are disclosed. The method includes: forming first regions of a first doping type and second regions of a second doping type in inner and edge regions of a semiconductor body; and forming body and source regions of transistor cells in the inner region. Forming the first and second regions includes: forming first and second implanted regions in the inner and edge regions, each first implanted region including at least dopant atoms of a first doping type and each second implanted region including at least dopant atoms of a second doping type; and diffusing the dopant atoms of both doping types in a thermal process such that dopant atoms of at least one of the first and second doping types have at least one of different diffusion rates and diffusion lengths in the inner and edge regions.

13 Claims, 13 Drawing Sheets

US 11,348,838 B2

METHOD FOR FORMING A SUPERJUNCTION TRANSISTOR DEVICE

TECHNICAL FIELD

This disclosure relates in general to a method for forming a superjunction transistor device, in particular a vertical superjunction transistor device.

BACKGROUND

A vertical superjunction transistor device includes a plurality of transistor cells. Each of the transistor cells includes a source region, a body region, a drift region, a compensation region, and a drain region in an inner region of the semiconductor body. The source and drift regions have a first doping type, and the body and compensation regions have a second doping type complementary to the first doping type. Further, a gate electrode is adjacent each body region and dielectrically insulated from the body region by a gate dielectric. The source region and the drain region of each cell are spaced apart from each other in a vertical direction of the semiconductor body, wherein the drain regions of the plurality of transistor cells may be formed by one contiguous semiconductor layer. A vertical superjunction transistor device may further include drift and compensation regions in an edge region of the semiconductor body, wherein the edge region surrounds the inner region and is free of body and source regions.

The transistor device can be operated in an on-state and an off-state. In the on-state, a drive voltage (gate-source voltage) is applied between the gate electrode and the source region such that there is a conducting channel in the body regions between the source regions and the drift regions. In the on-state, a current can flow between the drain region and the source regions when a voltage is applied between the drain region and the source regions. In the off-state, the gate electrode is driven such that the conducting channel in the body regions is interrupted. In this operating state, when a voltage is applied between the drain region and the source regions that reverse biases pn-junctions between the body regions or compensation regions and the drift regions, depletion regions (space charge regions) expand in the drift and compensation region. These depletion regions are associated with an electric field. An Avalanche breakdown may occur when the voltage applied between the drain region and the source regions is such that a magnitude of the electric field reaches a critical value.

In many cases it is desirable to design a superjunction transistor device such that a voltage blocking capability in the inner region is lower than in the edge region so that an Avalanche breakdown, if there is one, occurs in the inner region, which has a greater area (and volume) and a low ohmic connection to the source and drain terminals in comparison to the edge region.

There is therefore a need for producing a superjunction transistor device such that a voltage blocking capability in the edge region is higher than in the inner region.

SUMMARY

One example relates to a method. The method includes forming a plurality of first regions of a first doping type and a plurality of second regions of a second doping type in an inner region and an edge region of a semiconductor body, and forming body regions and source regions of a plurality of transistor cells in the inner region of the semiconductor body. Forming the first regions and the second regions includes forming a plurality of first implanted regions and a plurality of second implanted regions in the inner region and the edge region of the semiconductor body, wherein each of the first implanted regions includes at least dopant atoms of a first doping type, and wherein each of the second implanted regions includes at least dopant atoms of a second doping type, and diffusing the dopant atoms of the first doping type and the second doping in a thermal process such that dopant atoms of at least one of the first doping type and the second doping type have at least one of different diffusion rates and diffusion lengths in the inner region and the edge region.

One example relates to a transistor device. The transistor device includes a plurality of first regions of a first doping type and a plurality of second regions of a second doping type in an inner region and an edge region of a semiconductor body, a plurality of transistor cells each comprising a body region and a source region in the inner region of the semiconductor body. An effective lateral doping dose of the first regions in the edge region is lower than an effective lateral doping dose of the first regions in the inner region, and wherein an effective lateral doping dose of the second regions in the edge region is lower than an effective lateral doping dose of the second regions in the inner region.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
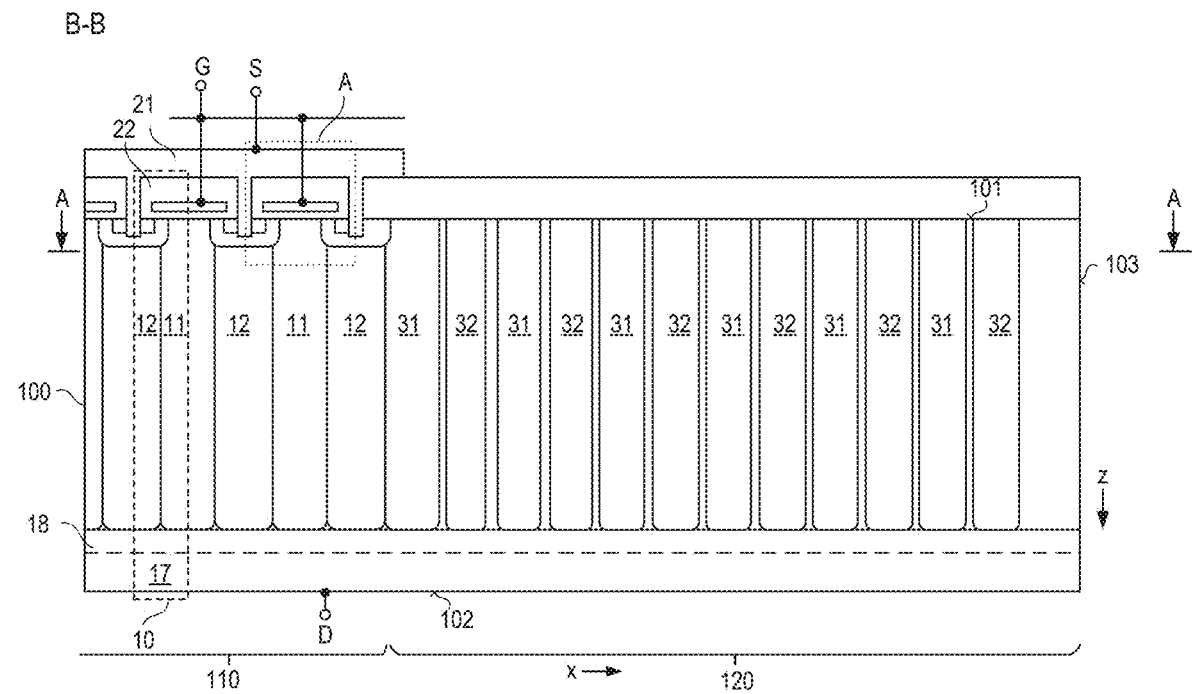
FIGS. 1A and 1B schematically illustrates a vertical cross-sectional view of a vertical superjunction transistor device.
Figure 1B:
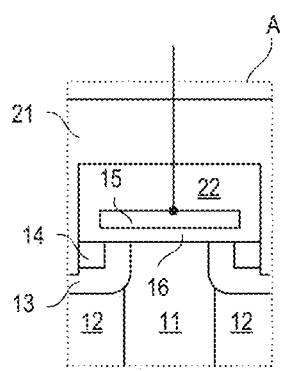

FIG. 1A schematically illustrates a vertical cross-sectional view of one example of a superjunction transistor device, and FIG. 1B illustrates a section "A" of this transistor device in greater detail. The transistor device includes a semiconductor body 100 with a first surface 101, a second surface 102 opposite the first surface 101, and an edge surface 103 extending from the first surface 101 to the second surface 102. The second surface 102 is spaced apart from the first surface 101 in a vertical direction z of the semiconductor body 100. The "vertical direction z" is a direction perpendicular to the first and second surfaces 101, 102. According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like.

The semiconductor body 100 includes an inner region 110 and an edge region 120. The edge region 120 is arranged between the edge surface 103 and the inner region 110, Further, the edge region, in a horizontal plane, surrounds the inner region 110. The "horizontal plane" is a plane parallel to the first and second surface 101, 102.

Referring to FIGS. 1A and 1B, the transistor device includes a plurality of transistor cells 10, wherein each of these transistor cells 10 includes active device regions in the inner region 110 of the semiconductor body 100. The active device regions of each transistor cell 10 include a first region 11 of a first doping type and a second region 12 of a second doping type complementary to the first doping type. The first regions 11 are also referred to as drift regions in the following, and the second regions 12 are also referred to as compensation regions in the following. Further, as illustrated in FIG. 1B, the active device regions of each transistor cell 10 include a body region 13 of the second doping type and a source region 14 of the first doping type, wherein the body region 13 is arranged between the source region 14 and the drift region 11 so that the source region 14 is separated from the drift region 11 by the body region 13. According to one example, the compensation region 12 adjoins the body region 13.

Further, referring to FIG. 1B, the active device regions of each transistor cell 10 include a drain region 17. The drain region 17 may adjoin the drift region 11 and the compensation region 12. Optionally, as illustrated in dashed lines in FIGS. 1A to 1B, a buffer region 18 of the first doping type may be arranged between the drain region 17 and each of the drift region 11 and the compensation region 12.

According to one example, the semiconductor body 100 includes monocrystalline silicon and the individual active device regions are implemented such that a respective doping concentration is in a range as outlined in the following: drift region 11: between 1E15 $cm^{-3}$ and 1E17 $cm^{-3}$; compensation region 12: between 1E15 $cm^{-3}$ and 1E17 $cm^{-3}$; body region 13: between 1E17 $cm^{-3}$ and 1E18 $cm^{-3}$; source region 14: between 1E18 $cm^{-3}$ and 1E21 $cm^{-3}$; drain region 17: between 1E18 $cm^{-3}$ and 1E21 $cm^{-3}$; optional buffer region 18: between 1E15 $cm^{-3}$ and 1E17 $cm^{-3}$.

Referring to FIGS. 1A and 1B, the drain regions 17 of the plurality of transistor cells 10 can be formed by one contiguous semiconductor region, which is referred to as drain region of the transistor device in the following. Further, the drift regions 11 of two neighboring transistor cells 10 can be formed by one contiguous semiconductor region of the first doping type, and the compensation regions 12 of two (other) transistor cells 10 can be formed by a contiguous semiconductor region of the second doping type.

Referring to FIGS. 1A and 1B, each transistor cell further includes a gate electrode 15 that is arranged adjacent to the body region 13 and that is dielectrically insulated from the body region 13 by a gate dielectric 16. The gate electrode 15 serves to control a conducting channel in the body region 13 between the source region 14 and the drift region 11. The gate electrodes 15 of the individual transistor cells are connected to a gate node G. The gate node G as well as connections between the gate electrodes 15 and the gate node G are only schematically illustrated in FIGS. 1A to 1B. Further, the source and body regions 14, 15 of the individual transistor cells 10 are connected to a source electrode 21 that is electrically insulated from the gate electrodes 15 by an insulation layer 22. The source electrode 21 is connected to a source node S or forms a source node S of the transistor device. Further, the drain region 17 is connected to a drain node D of the transistor device.

The transistor device can be an n-type transistor device or a p-type transistor device. In an n-type transistor device, the source regions 14 and the drift regions 11 are n-type semiconductor regions and the body regions 13 and the compensation regions 12 are p-type semiconductor regions. In a p-type transistor device the doping types of the individual active device regions are complementary to the doping type of corresponding device regions in an n-type transistor device. Further, the transistor device can be implemented as a MOSFET (Metal Oxide Semiconductor Field-Effect Transistor) or as an IGBT (Insulated Gate Bipolar Transistor). In a MOSFET, the drain region 17 has the same doping type as the source region 14. In an IGBT (Insulated Gate Bipolar Transistor), the drain region 17 has a doping type complementary to the doping type of the source region 14.

The transistor device can be operated in an on-state or an off-state. In the on-state, the gate electrodes 15, by applying a suitable voltage (gate-source voltage) between the gate node G and the source node S, are driven such that there is a conducting channel in the body region 13 between the source region 14 and the drift region 11 when a voltage (drain-source voltage) higher than zero is applied between these circuit nodes D, S. By virtue of this conducting channel a current can flow between the drain node D and the source node S. In the off-state, the gate electrodes 15 are driven such that the conducting channel in the body regions 13 between the source regions 14 and the drift regions 11 are interrupted. In the off-state, when applying a voltage between the drain node D and the source node S that reverse biases pn-junctions between the drift regions 11 on one side and the body regions 13 and compensations regions 12 on the other side, space charge regions (depletion regions) expand in the semiconductor body 100. In this operating state, a current flow through the transistor device is prevented.

Referring to FIG. 1A, the transistor device further includes a plurality of first regions 31 of the first doping type and a plurality of second regions 32 of the second doping type in the edge region 120 of the semiconductor body 100. Throughout the description, reference numbers 11 and 31 denote first regions, which are regions of the first doping type. Reference number 11 denotes those sections of the first regions or those first regions that are arranged in the inner region 110 of the semiconductor body 100, and reference number 31 denotes those sections of the first regions or those first regions that are arranged in the edge region 120 of the semiconductor body 100. Equivalently, reference numbers 12 and 32 denote second regions, which are regions of the second doping type, wherein reference number 12 denotes those sections of the second regions or those second regions that are arranged in the inner region 110, and reference number 32 denotes those sections of the second regions or those second regions that are arranged in the edge region 120 of the semiconductor body 100.

In the inner region 110, each of the first and second regions 11, 12 adjoins at least one body region 13. In the edge region 120, the majority of the first and second regions 31, 32 do not adjoin a body region. According to one example, at most an innermost one of the first and second regions 31, 32 located in the edge region 120 adjoins a body region of a transistor cell.

Figure 2A:
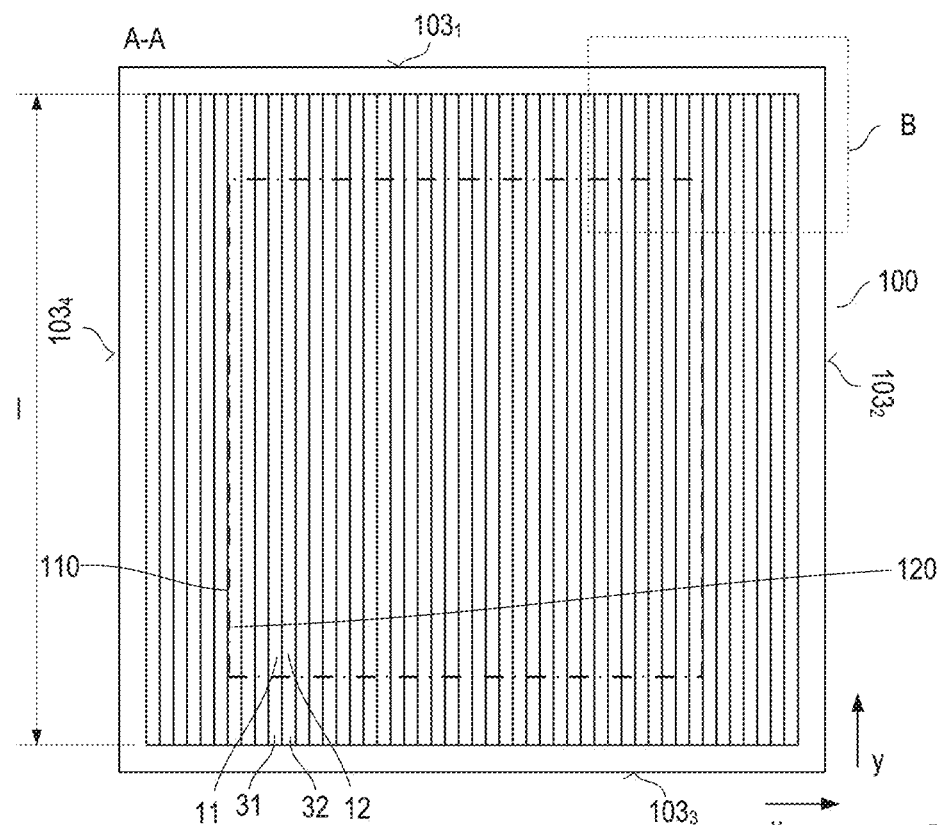
FIGS. 2A and 2B schematically illustrates a horizontal cross-sectional view of a transistor device of the type shown in FIGS. 1A and 1B.
Figure 2B:
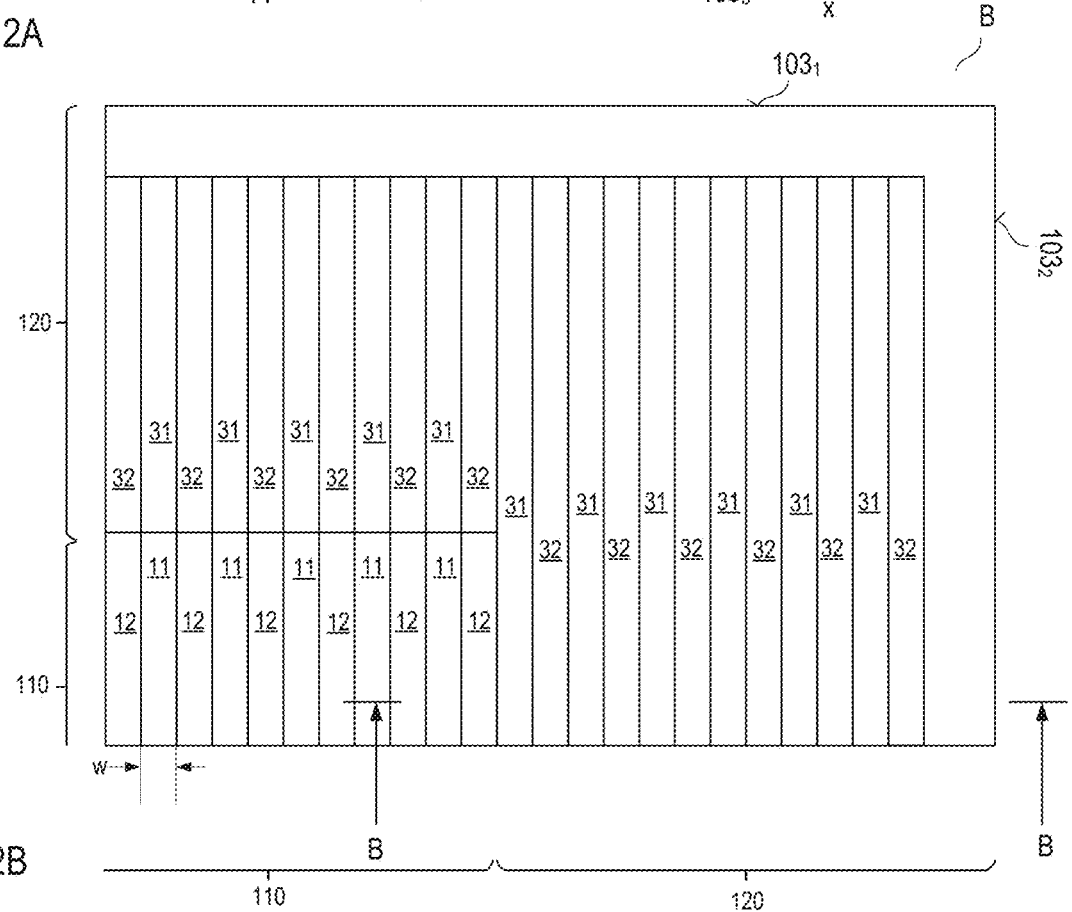

FIG. 2A schematically illustrates a horizontal cross-sectional view of the semiconductor body 100 in a horizontal section plane A-A illustrated in FIG. 1A. FIG. 2B, illustrates a section "B" shown in FIG. 2A in greater detail.

Referring to FIG. 2A, the semiconductor body 100 may be rectangular in the horizontal plane A-A so that the edge surface 103 has four edge surface sections, $103_1$, $103_2$, $103_3$, $103_4$. Referring to FIG. 2A, the first regions 11, 31 and the second regions 12, 32 may be arranged alternatingly in a first horizontal (lateral direction) x of the semiconductor body 100 and may be elongated in a second horizontal direction y, wherein the second horizontal direction y is perpendicular to the first horizontal direction x. In the example illustrated in FIG. 2A, the first and third edge surface sections $103_1$, $103_3$ are essentially parallel to the first horizontal direction x, and the second and fourth edge surface sections $103_2$, $103_4$ are essentially parallel to the second lateral direction y. In this case, the first regions 11, 31 and the second regions 12, 32 are essentially perpendicular to the first and third edge surface sections $103_1$, $103_3$ and essentially parallel to the second and fourth edge surface sections $103_2$, $103_4$. "Elongated" means that a length 1 of the first and second regions 11, 31, 12, 32 is significantly greater than a width w of the first and second regions 11, 31, 12, 32. The length 1 is the dimension of the first and second regions 11, 31, 12, 32 in the second horizontal direction y, and the width w is the dimension of the first and second semiconductor regions 11, 31, 12, 32 in the first horizontal direction x. According to one example, a ratio l/w between the length and the width w is at least 100, at least 1000, or at least 10000.

Referring to FIGS. 2A and 2B, some of the first regions 31 are entirely arranged in the edge region 120, while others of the first regions have sections 11 in the inner region 110 and sections 31 in the edge region 120. Equivalently, some of the second regions 32 are entirely arranged in the edge region 120, while others of the second regions have sections 12 in the inner region 110 and sections 32 in the edge region 120.

In order to achieve a high avalanche robustness of the transistor device it is desirable to implement the first and second regions such that first regions 31 located in the edge region 120 are more lowly doped than first regions 11 located in the inner region 110 and such that second regions 32 arranged in the edge region 120 are more lowly doped than second regions 12 arranged in the inner region 110.

"More lowly doped" means that a lateral doping dose of the first regions 31 in the edge region 120 is lower than a lateral doping dose of the first regions 11 in the inner region 110, and that a lateral doping dose of the second regions 32 in the edge region 120 is lower than a lateral doping dose of the second regions 12 in the inner region 110. The "lateral doping dose" of a first region 11, 31 is the integral of the effective doping concentration of the first doping type of the first region 11, 31 in a direction perpendicular to a pn-junction between the first region 11, 31 and an adjoining second region 12, 32. Equivalently, the "lateral doping dose" of a second region 12, 33 is the integral of the effective doping concentration of the second doping type of the second region 12, 32 in a direction perpendicular to a pn-junction between the second region 12, 32 and an adjoining first region 11, 31. In the example shown in FIGS. 1A-1B and 2A-2B, the direction perpendicular to pn-junctions between the first regions 11, 31 and adjoining second regions 12, 32 is the first lateral direction x. The lateral doping dose may also be referred to as "effective lateral doping dose" in the following.

The "effective doping concentration" of a first region 11, 31 is given by the concentration of dopant atoms of the first doping type minus the concentration of dopant atoms of the second doping type (so that the effective doping concentration is zero, for example, if the concentration of dopant atoms of the first doping type equals the concentration of dopant atoms of the second doping type). Equivalently, the "effective doping concentration" of a second region 12, 32 is given by the concentration of dopant atoms of the second doping type minus the concentration of dopant atoms of the first doping type.

The lateral doping doses of the first regions 11, 31 and the second region 12, 32 may vary in the vertical direction z. According to one example, "first regions 31 located in the edge region 120 being more lowly doped than first regions 11 located in the inner region 110" means that there is at least one vertical position of the semiconductor body 100 at which at least some of the first regions 31 located in the edge region 120 are more lowly doped than the first regions 11 located in the inner region 110. Equivalently, according to one example, "second regions 32 located in the edge region 120 being more lowly doped than second regions 12 located in the inner region 110" means that there is at least one vertical position of the semiconductor body 100 at which at least some of the second regions 32 located in the edge region 120 are more lowly doped than the second regions 12 located in the inner region 110.

The lateral doping dose of a first region 11, 31 or a second region 12, 32 at a certain vertical position is dependent (a) on a dimension of the respective first or second region 11, 31, 12, 32 in the lateral dimension x, and (b) the effective doping concentration of the first doping type (in first regions 11, 31) or the second doping type (in second regions 12, 32) wherein the latter may vary in the lateral direction x.

Examples of a method for implementing the first regions 11, 31 and the second regions 12, 32 such that at least some of the first and second regions 31, 32 in the edge region 120 at least at one vertical position are more lowly doped than the first and second regions 11, 12 in the inner region 120 are explained in the following. Basically, the method includes forming a plurality of implanted regions in the inner region 110 and the edge region 120 of the semiconductor body 100 and suitably adjusting a diffusion rate and/or a diffusion lengths of dopant atoms included in the implanted regions. Dependent on the specific type of method, (a) each of the implanted regions may include both dopant atoms of the first doping type and the second doping type, or (b) each of the implanted regions may include dopant atoms of only one of the first doping type and the second doping type.

Figure 3:
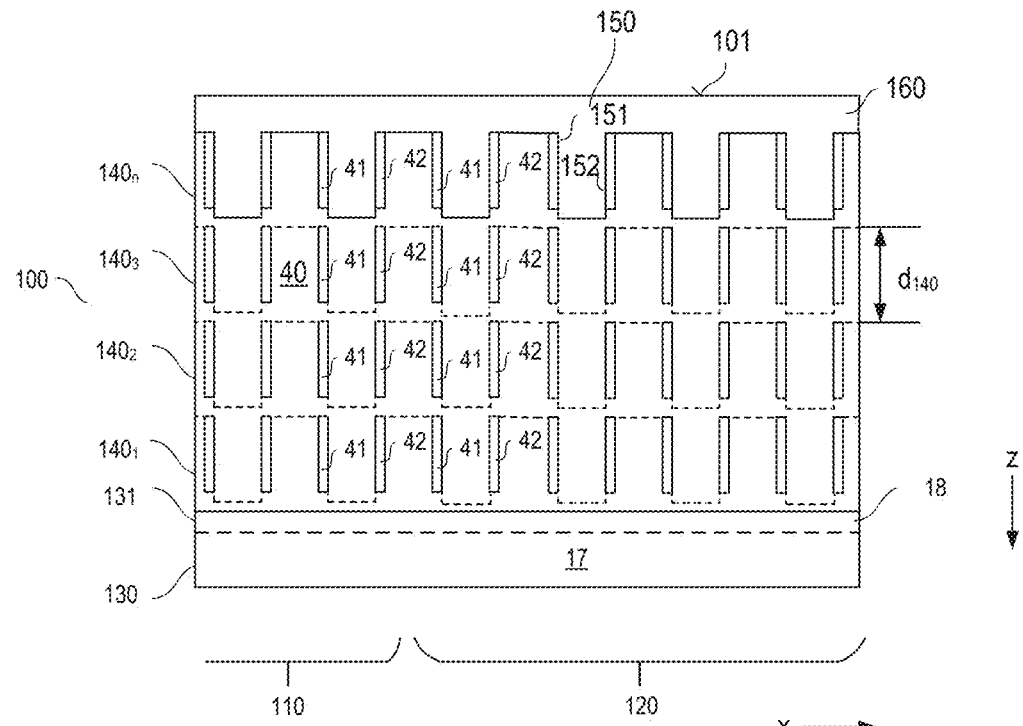
FIG. 3 illustrates a vertical cross-sectional view of a semiconductor body according to one example that includes a plurality of first implanted regions and a plurality of second implanted regions.

One example of a method for forming a plurality of implanted regions 41, 42 in the semiconductor body 100 is illustrated in FIG. 3. More specifically, FIG. 3 illustrates the semiconductor body 100 after process steps for forming a plurality of first implanted regions 41 and a plurality of second implanted regions 42 in the inner region 110 and the edge region 120 the semiconductor body 100. This method includes forming a plurality of semiconductor layers $140_1$-$140_n$ one on top of the other, forming a plurality of trenches 150 in each of the plurality of semiconductor layers $140_1$-$140_n$, and implanting dopant atoms into opposite first and second sidewalls 151, 152 of each of the plurality of trenches 150 before forming a next one of the semiconductor layers $140_1$-$140_n$. First implanted regions 41, 51 are formed by implanting the dopant atoms into the first sidewalls 151, and second implanted regions 42, 52 are formed by implanting the dopant atoms into the second sidewalls 152. The first implanted regions 41 and the second implanted regions 42 are formed in the inner region 110 and the edge region 120 in the same way.

Referring to FIG. 3, the trenches 150 in each but an uppermost one $140_n$ of the semiconductor layers $140_1$-$140_n$ are filled by forming the respective next one of the semiconductor layers $140_1$-$140_n$. The trenches in the uppermost semiconductor layer $140_n$ are filled by forming a further semiconductor layer 160 on top of the uppermost semiconductor layer $140_n$. This further semiconductor layer 160 forms the first surface 101 of the semiconductor body 100. The "uppermost semiconductor layer $140_n$" is the last one of the plurality semiconductor layers $140_1$-$140_n$ in which trenches 150 are formed.

According to one example, forming each of the plurality of semiconductor layers $140_1$-$140_n$ and the further semiconductor layer 160 includes an epitaxial growth process so that each of these semiconductor layers $140_1$-$140_n$, 160 is a monocrystalline epitaxial layer. Referring to FIG. 3, a first one $140_1$, which may also be referred to as lowermost one, of the plurality of semiconductor layers $140_1$-$140_n$ is grown on a carrier 130. According to one example, the carrier 130 is a monocrystalline semiconductor substrate that forms the drain region 17 of the finished semiconductor device.

Optionally, the carrier 130, 131 includes a first section that forms the drain region 17 in the finished device and a second section 18 (illustrated in dashed lines in FIG. 3) that is arranged between the first section and the lowermost semiconductor layer $140_1$ and forms a buffer region. The first section may be formed by a semiconductor substrate 130 and the second section may be formed by an epitaxial layer 131 grown on the substrate 130. According to one example, the buffer region 18 has a lower doping concentration than the drain region 17. A doping of the buffer region 18 may be formed in various ways. According to one example, forming the buffer region 18 includes in-situ doping the epitaxial layer 131 in the epitaxial growth process. According to another example, forming the buffer region 18 includes growing an intrinsic epitaxial layer 131 and blanket implanting dopant atoms into the epitaxial layer 131.

The semiconductor body 100 with the substrate 130, the optional epitaxial layer 131, and the plurality of semiconductor layers $140_1$-$140_n$ may be a monocrystalline semiconductor layer. In this case, in the semiconductor body 100, there are no visible borders between the individual semiconductor layers $140_1$-$140_n$. However, for illustration purposes borders between the individual semiconductor layers $140_1$-$140_n$ are illustrated in dashed lines in FIG. 3.

Further, forming the plurality of semiconductor layers $140_1$-$140_n$ (one on top of the other and on top of the substrate 130) may take place on a wafer level. That is, a plurality of semiconductor bodies 100 can be processed at once by being part of a wafer that includes a plurality of semiconductor bodies 100, at a later stage of the manufacturing process, the wafer is divided in order to form a plurality of semiconductor bodies 100. Edge surfaces 103 of the individual semiconductor bodies 100 are formed by dividing the wafer into the individual semiconductor bodies 100. Thus, at the manufacturing stage illustrated in FIG. 3, the edge surface 103 has not necessarily been formed yet. In this case, the lines labelled with reference characters 103, $103_1$, $103_2$, $103_3$, $103_4$ in FIGS. 2A and 2B, illustrate where the edge surface and its sections will be relative to the first and second regions 11, 12, 31, 32 after forming the plurality of semiconductor bodies 100 from one wafer.

FIG. 3 illustrates the semiconductor body 100 after forming each of the plurality of semiconductor layers $140_1$-$140_n$ and the further semiconductor layer 160. Just for the purpose of illustration, the plurality of semiconductor layers $140_1$-$140_n$ includes n=4 semiconductor layers. This, however, is only an example. According to one example, the number n of semiconductor layers is selected from between 1 and 20, in particular from between 3 and 15. According to one example, the semiconductor layers $140_1$-$140_n$ are formed such that their respective thickness $d_{140}$ is between 2 micrometers and 12 micrometers. The thickness $d_{140}$ of one layer $140_i$ (wherein $140_i$ denotes an arbitrary one of the semiconductor layers $140_1$-$140_n$) is the dimension of the semiconductor layer $140_i$ outside the trenches 150 and in the vertical direction z.

According to one example, the trenches 150 are elongated trenches. That is, a length, which is a dimension of these trenches 150 in a direction perpendicular to the section plane illustrated in FIG. 3, is much greater than a width, which is a dimension of these trenches 150 in the first horizontal direction x. According to one example, a ratio between the length and the width is at least 100, at least 1000, or at least 10000.

According to one example, as illustrated in FIG. 3, the trenches 150 formed in the individual semiconductor layers $140_1$-$140_n$ are aligned in the vertical direction z. In this case, that first implanted regions 41 formed in different semiconductor layers $140_1$-$140_n$ are essentially aligned in the vertical direction z and the second implanted regions 42 formed in different semiconductor layers $140_1$-$144_n$ are essentially aligned in the vertical direction z.

In the example illustrated in FIG. 3, the trenches 150 have been formed such that each of these trenches 150 is formed inside only one of the semiconductor layers $140_1$-$140_n$. That is, each of the trenches 150 formed in a semiconductor layer $140_i$ (wherein $140_i$ denotes an arbitrary one of the semiconductor layers $140_1$-$140_n$) does not extend into a semiconductor layer $140_{i-1}$ that has been directly formed before the semiconductor layer $140_i$. This, however, is only an example. According to another example (not illustrated) the trenches 150 formed in one semiconductor layer $140_i$ may extend into the semiconductor layer $140_{i-1}$ formed before.

Figure 4:
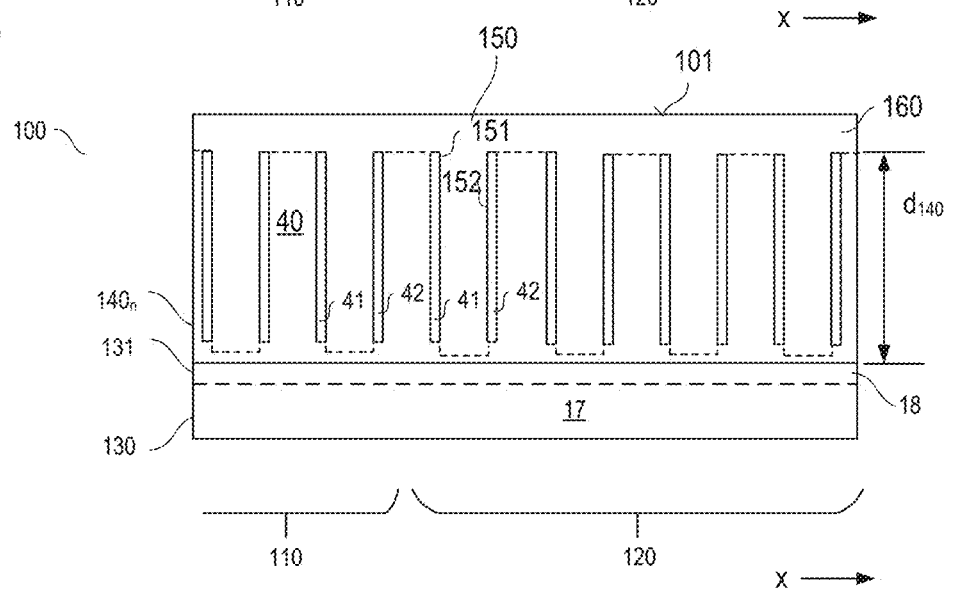
FIG. 4 illustrates a vertical cross-sectional view of a semiconductor body according to another example that includes a plurality of first implanted regions and a plurality of second implanted regions.

Referring to the above, the number of semiconductor layers $140_1$-$140_n$ may vary between 1 and 20. FIG. 4 shows a vertical cross-sectional view of a semiconductor body 100 of the type shown in FIG. 3 that includes only one (n=1) semiconductor layer $140_1$ with implantation regions 41, 42. This semiconductor layer $140_n$ (which, at the same time, is the uppermost layer and the lowermost layer) is formed on the carrier 130 (or 130, 131) and has its trenches 150 filled by the further semiconductor layer 160.

The first and second implanted regions 41, 42 may be implemented such that at each vertical position of the semiconductor body 100, a doping profile of the first implanted regions 41 in the inner region 110 essentially equals a doping profile of the first implanted regions 41 in the edge region 120, and a doping profile of the second implanted regions 42 in the inner region 110 essentially equals a doping profile of the second implanted regions 42 in the edge region 120. The "doping profile" of a first or second implanted region 41, 42 at a certain vertical position is defined by the type of dopant atoms included in the respective implanted region 41, 42 at the certain vertical position and the associated implantation dose. Thus, the first regions 41 in the inner region 110 and the edge region 120 may be produced by the same process, and the second regions 42 in the inner region 110 and the edge region 120 may be produced by the same process. Examples of a process for forming the first and second implanted regions 41, 42 are explained herein further below.

Referring to the above, first regions 11, 31 with different lateral doping doses in the inner region 110 and the edge region 120 and second regions 12, 32 with different lateral doping doses in the inner region 110 and the edge region 120 may be formed from the implanted regions 41, 42 by suitably adjusting at least one of the diffusion rate and the diffusion length of the dopant atoms included in the first and second implanted regions 41, 42.

According to one example, each of the first implanted regions 41 and each of the second implanted regions 42 includes both, dopant atoms of the first doping type and dopant atoms of the second doping type, wherein these dopant atoms are selected such that they have different diffusion coefficients. According to one example, the first type dopant atoms are arsenic (As) or antimony (Sb) atoms, and the second type dopant atoms are boron (B) atoms. Boron, which is a p-type dopant, diffuses faster than As or Sb, which are n-type dopants. Further, the method is such that in a thermal process that electrically activates at least a portion of the dopant atoms included in the first and second implanted regions 41, 42 at least one type of dopant atoms in the edge region 120 diffuses slower than the corresponding type of dopant atoms in the inner region 110. "To electrically activate" means to incorporate dopant atoms into the crystal lattice of the semiconductor body. One example of a method of this type is illustrated in FIGS. 5A-5C.

Figure 5A:
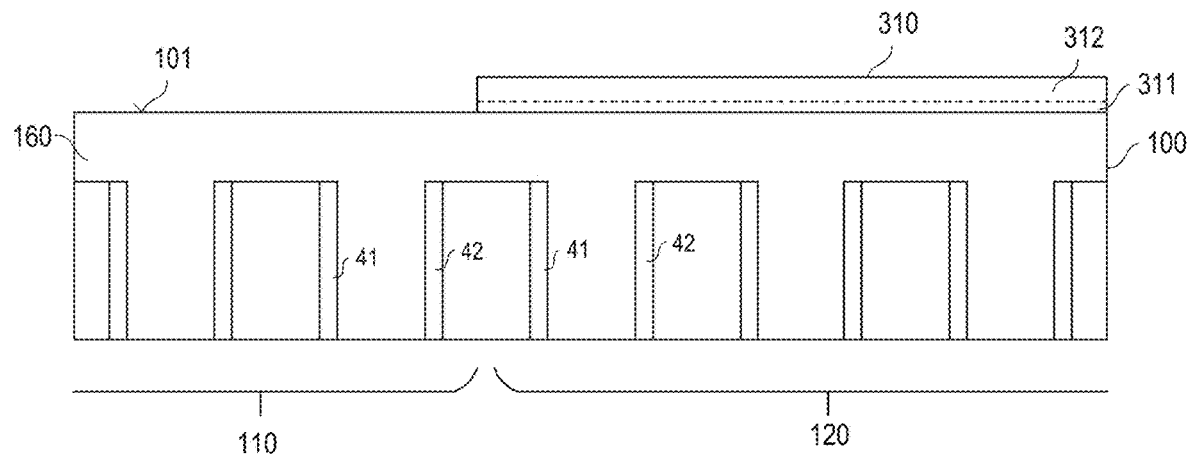
FIGS. 5A to 5B illustrate one example of a method for diffusing first type dopant atoms and second type dopant atoms included in the first and second implanted regions, wherein the method includes forming a protection layer on an edge region of the semiconductor body and a thermal oxidizing process.
Figure 5B:
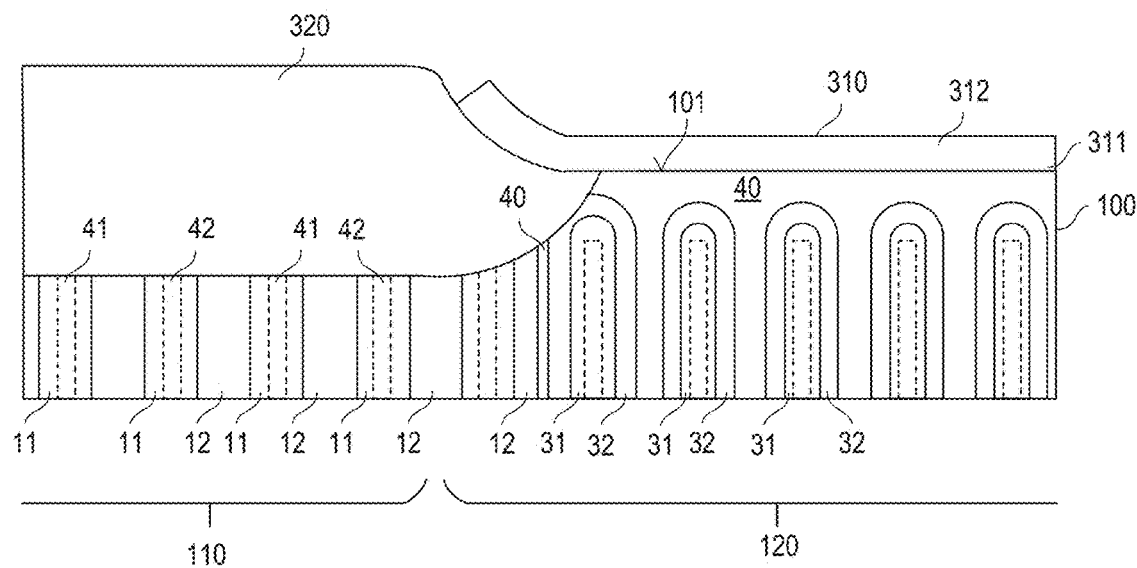

Each of FIGS. 5A to 5C illustrates a vertical cross-sectional view of one section of the semiconductor body 100. More specifically, each of these FIGS. 5A to 5C shows a section of the further semiconductor layer 160 and the uppermost semiconductor layer $140_n$ with the first and second implanted regions 41, 42 during different process steps.

Referring to FIG. 5A, the method includes forming a protection layer 310 on the first surface 101 in the edge region 120. This protection layer 310 is configured to protect the first surface 101 from being oxidized in a thermal process in an oxidizing atmosphere. According to one example, the protection layer 310 includes a nitride layer such as a silicon nitride ($Si_3N_4$) layer. Optionally, the protection layer 310 includes an oxide layer 311 (illustrated in dashed lines in FIG. 5A) on top of the first surface 101 and a nitride layer 312 on top the oxide layer 311. The oxide layer 311 may help to selectively remove the protection layer 311 from the surface 101 after the thermal diffusion process explained below. The oxide layer 311 may be a thermally grown layer or a deposited layer.

Referring to FIG. 5B, the method further includes a thermal process in an oxidizing atmosphere, wherein FIG. 5B shows the semiconductor body 100 after this thermal oxidation process. The atmosphere in this process may be a dry oxidizing or a wet oxidizing atmosphere. Referring to FIG. 5B, in thermal oxidation process, an oxide layer 320 is grown on the first surface 101 in the inner region 110 of the semiconductor body 100. The growth of this oxide layer 320 "consumes" semiconductor material (such as silicon) of the semiconductor body 100 so that the oxide layer 320 grows both into the semiconductor body 100 and upwards from the semiconductor body 100. In a lateral direction, the oxide layer 320 may grow partially below the protection layer 310. The growth of the oxide layer 320 on the semiconductor body 100 in the inner region 110 is associated with an injection of interstitials (which may also be referred to as self-interstitials) into the semiconductor body 100. These interstitials diffuse in the semiconductor body 100 and have a significantly higher diffusion coefficient than dopant atoms so that interstitials may also diffuse into the edge region 120. In the inner region 110 a portion of the injected interstitials recombines at an interface between the oxide layer 320 and the semiconductor body 100, and in the edge region 120 at least a portion of the interstitials diffusing from the inner region 110 into the edge region 120 recombines at an interface between the semiconductor body 100 and the protection layer 310. During the thermal process, a concentration of interstitials in the inner region 110 is higher than a concentration of interstitials in the edge region 120 because (a) due to the protection layer 310 an oxide layer, which promotes an injection of interstitials into the semiconductor body 100, is not formed on the semiconductor body 100 in the edge region 120, and (b) interstitials diffusing into the edge region 120 at least partially recombine at the interface between the semiconductor body 100 and the protection layer 310.

Referring to the above, the dopant atoms included in the first and second implanted region 41, 42, are selected such that, under the same thermal conditions, one type of dopant atoms diffuses faster than the other type of dopant atoms. According to one example, the faster diffusing type of dopant atoms is selected such that a diffusion of dopant atoms of this type is promoted by interstitials. According to one examples, the second type of dopant atoms is the type of dopant atoms that diffuses faster, and the second type of dopant atoms includes boron (B) atoms the diffusion of which is promoted by interstitials.

At a given duration and a given temperature of the thermal process, dopant atoms of the second doping type have a higher average diffusion length in the inner region 110 than in the edge region 120, because of the higher concentration of interstitials in the inner region 110 than in the edge region 120. Thus, there is a difference in the diffusion lengths of the second type doping atoms in the inner region 110 and the edge region 120. The dopant atoms of the first doping type may essentially have the same average diffusion length in the inner region 110 and the edge region 120.

For explanation purposes it is assumed that at a certain vertical position the number (the dose) of first type dopant atoms and the number (the dose) of second type dopant atoms in the first and second regions 41, 42 is essentially the same so that, without a diffusion process, the effective doping concentration would be essentially zero. Due to the different diffusion coefficients (different average diffusion lengths) of the first and second type doping atoms, a separation process takes place such that the dopant atoms of the second doping type move away faster from the position of the first and second implanted regions 41, 42 than the dopant atoms of the first doping type, so that second regions 12, 32 with an effective doping concentration of the second doping type and first regions 11, 31 with an effective doping concentration of the first doping type are formed. Basically, the higher the difference between the diffusion coefficients (diffusion lengths) of the first and second type dopant atoms the stronger is the separation effect. In the edge region 120, the average diffusion lengths of the second type dopant atoms are lower than in the inner region 110. Thus, a difference between the diffusion coefficients (diffusion lengths) of the first and second type dopant atoms in the edge region 120 is lower than in the inner region 110, so that the separation of first type doping atoms and second type doping atoms in the edge region is weaker than in the inner region 110. This has the effect, that in the edge region 120 a lateral doping dose of the resulting first and second regions 31, 32 is lower than a lateral doping dose of the first and second regions 11, 12 in the inner region 110.

According to one example, a temperature in the thermal process is between 1000° C. and 1200° C., and the duration of the thermal process is between 20 minutes and 10 hours. The temperature process may take place in a dry oxidizing or a wet oxidizing atmosphere.

Figure 6:
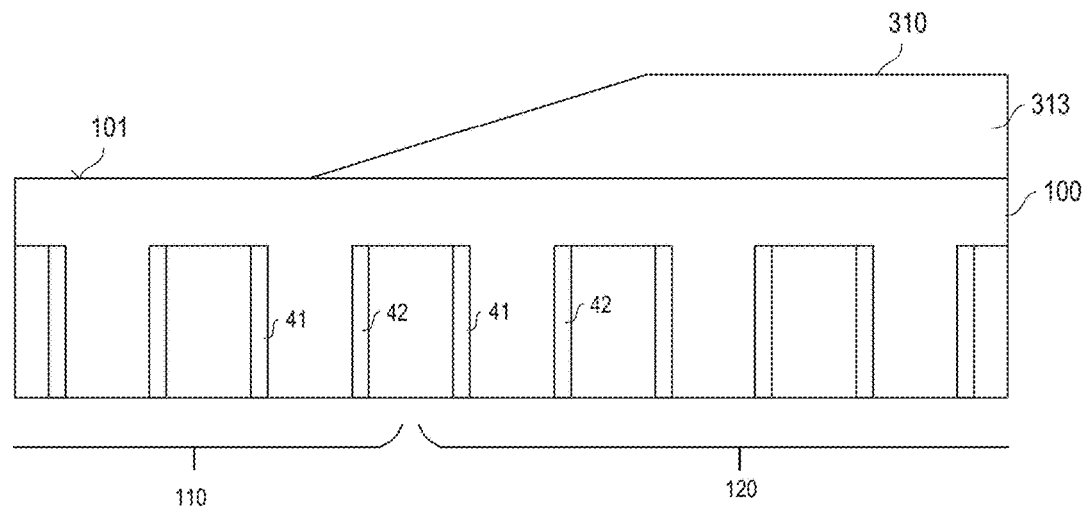
FIG. 6 illustrates a protection layer according to another example.

Referring to the above, the protection layer 310 may include a deposited nitride layer 312, wherein an oxide layer 311 may be formed between the first surface 101 and the nitride layer 312. According to another example, illustrated in FIG. 6, the protection layer 310 includes an oxide layer 313 deposited on the first surface 101. According to one example, a thickness of this protection layer 310 may gradually increase between the inner region 110 and the edge region 120. The function of the protection layer 310 shown in FIG. 6 is the same as the function of the protection layer 310 shown in FIGS. 5A to 5C. That is, the protection layer 310 protects the first surface 101 of the semiconductor body 100 from being oxidized in the thermal process that activates and diffuses the dopant atoms in the first and second implanted regions 41, 42. The increase of the thickness of the protection layer 310 has the effect that the concentration of interstitials gradually increases from edge region 120 towards the inner region 110 so that the lateral doping dose of the first and second regions 31, 32 gradually increases towards the inner region 110.

Figure 7A:
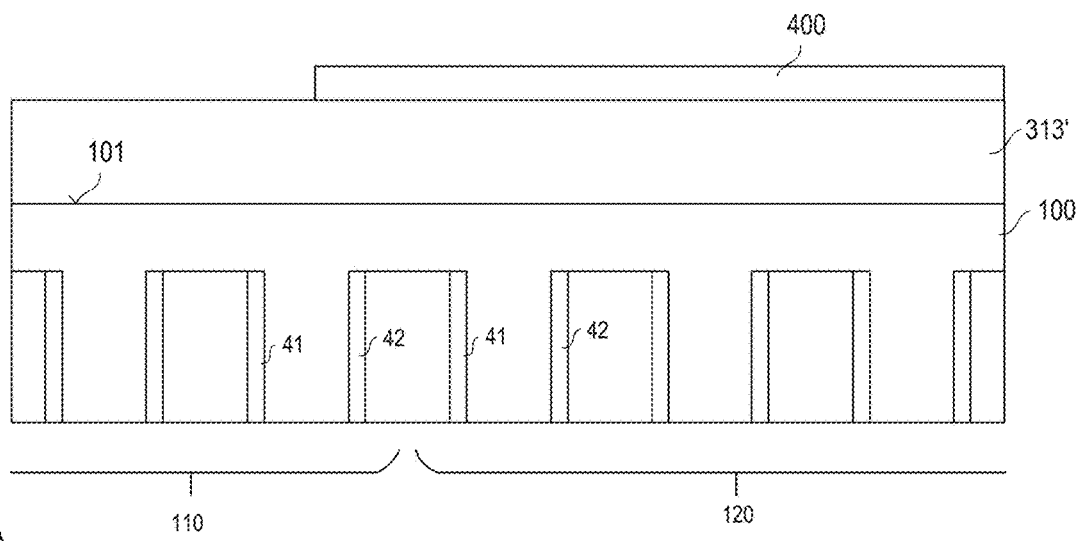
FIGS. 7A to 7B illustrate one example of a method forming a protection layer of the type shown in FIG. 6.
Figure 7B:
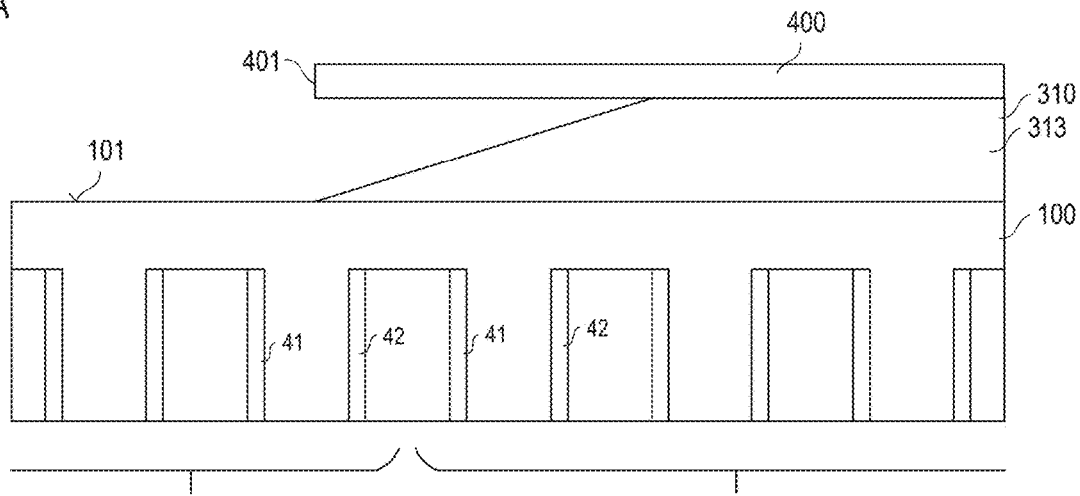

FIGS. 7A to 7B illustrate one example of a method for forming a protection layer 310 of the type shown in FIG. 6. Referring to FIG. 7A this method includes depositing an oxide layer 313' on the first surface 101 in the inner region 110 and the edge region 120. Depositing the oxide layer 313' may include a conventional oxide deposition process such as a process using TEOS (tretraethoxysilane).

Further, referring to FIG. 7B, forming the protection layer 310 may include forming an etch mask 400 on the oxide layer 313' above the edge region 120 and isotropically etching the oxide layer 313' with the etch mask 400 in place. In the isotropic etching process, the oxide layer 313' is removed down to the first surface 101 in those sections that are not covered by the mask layer 400. However, in this etching process, the oxide layer 313' is also partially removed below the mask layer 400 in a region adjoining an edge 401 of the mask layer 400. This results in a gradual increase of the thickness (a ramp) of the resulting protection layer 310 above a border between the inner region 110 and the edge region 120. Optionally, the method further includes a damage implantation process before forming the mask layer 400. This process damages the oxide layer 313' and may support the formation of the ramp of the oxide layer 313 in the etching process. Before performing the thermal oxidation process that oxidizes the first surface 101 in the inner region 110, the mask layer 400 is removed (as illustrated in FIG. 6).

Figure 8:
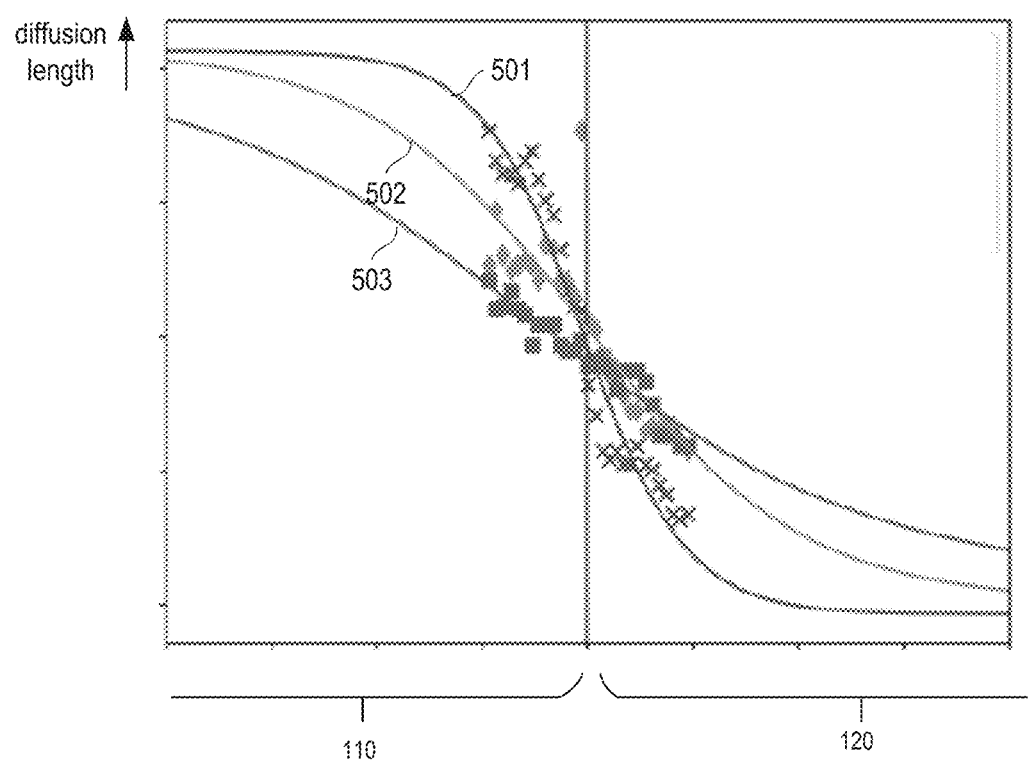
FIG. 8 illustrates the diffusion length of boron atoms in an inner region and the edge region at different vertical positions of the semiconductor body.

Referring to the above, the oxide layer 320 grown on the first surface 101 above the inner region 110 promotes the injection of interstitials into the semiconductor body 100, and the protection layer 310 prevents or at least inhibits the injection of interstitials into the first surface 101 in the edge region 120. Further, interstitials may promote the diffusion of certain types of dopant atoms. This is illustrated in FIG. 8. FIG. 8 illustrates the diffusion length of boron atoms in the inner region 110 and the edge region 120 of the semiconductor body in a thermal process of the type illustrated in FIG. 5B. Curves 501-503 shown in FIG. 8 illustrate the diffusion lengths at different vertical positions d1, d2, d3 of the semiconductor body 100. More specifically, curve 501 illustrates the diffusion lengths at a first vertical position, curve 502 illustrates the diffusions lengths at a second vertical position, and curve 503 illustrates the diffusion lengths at a third vertical position. The first vertical position is spaced apart from the first surface 101 by a first distance d1, the second vertical position is spaced apart from the first surface 101 by a second distance d2, and the third vertical position is spaced apart from the first surface 101 by a third distance d3, wherein d1<d2<d3. According to one example, d1 is about 9 micrometers, d2 is about 25 micrometers and d3 is about 40 micrometers. As can be seen from FIG. 8, in each case, the diffusion length in the inner region 110 is greater than in the edge region 120.

Further, referring to FIG. 8, in the inner region 110, the diffusion length may decrease as the distance to the first surface 101 increases, and in the edge region 120, the diffusion length may decrease as the distance to the first surface 101 decreases. Referring to the above, the first surface 101 in the inner region 110 acts as an interstitial source, so that the interstitial concentration is particularly high at the first surface 101 in the inner region 110. Further, the first surface 101 in the edge region 120 acts as an interstitial sink, so that the interstitial concentration is particularly low at the first surface 101 in the edge region 110. The interstitial concentration at a certain position is therefore dependent on a distance of this position to the interstitial source, that is, the first surface 101 in the inner region 110, and a distance of this position to the interstitial sink, that is, the first surface 101 in the edge region. Basically, the greater a difference between the distance to the interstitial source and the distance to the interstitial sink, the higher the interstitial concentration, and the lower the difference between the distance to the interstitial source and the distance to the interstitial sink, the lower the interstitial concentration. This explains the decrease of the diffusion length in the inner region 110 as the distance to the first surface 101 increases and the increase of the diffusion length in the edge region 120 as the distance to the first surface 101 increases.

In the example illustrated in FIGS. 5A and 5B, the protection layer 310 completely covers the first surface 101 on top of the edge region 120. This, however, is only an example. According to another example (not illustrated), the protection layer 310 is formed such that it only covers sections of the first surface 101 in the edge region 120, while other sections of the first surface 101 are not covered by the protection layer 310. In this case, the edge region 120 includes sections in which the diffusion of a certain type of dopant atoms (such as boron atoms) is promoted by interstitials and other sections in which such diffusion is not promoted.

In the example explained with reference to FIGS. 5A and 5B, interstitials injected into the inner region 110 of the semiconductor body 100 promote the diffusion of dopant atoms of a certain type (such as boron atoms). According to another example illustrated in FIGS. 9A and 9B, vacancies are injected into the edge region 120 of the semiconductor body 100. Further the first type of dopant atoms is selected such that the diffusion of dopant atoms of this doping type is promoted by vacancies, and the second type of dopant atoms is selected such that the diffusion of dopant atoms of this doping type is widely independent on the presence of vacancies and that the dopant atoms of this doping type diffuse faster than the dopant atoms of the first doping type. According to one example, the dopant atoms of the first doping type are arsenic (As) or antimony (Sb) atoms and the dopant atoms of the second doping type are boron (B) atoms.

The injection of vacancies into the edge region 120 may include forming a stress layer 330 on top of the first surface 101 in the edge region 120. This stress layer 330 induces mechanical stress along the first surface 101 in the edge region 120, wherein this mechanical stress promotes the injection (generation) of vacancies in the edge region 120. According to one example, this stress layer 330 is a nitride layer that is directly formed on the first surface 101. Forming this layer may include forming a nitride layer all over the first surface 101 and removing the nitride layer from the first surface 101 above the inner region 110 in an etching process (not illustrated).

Figure 9A:
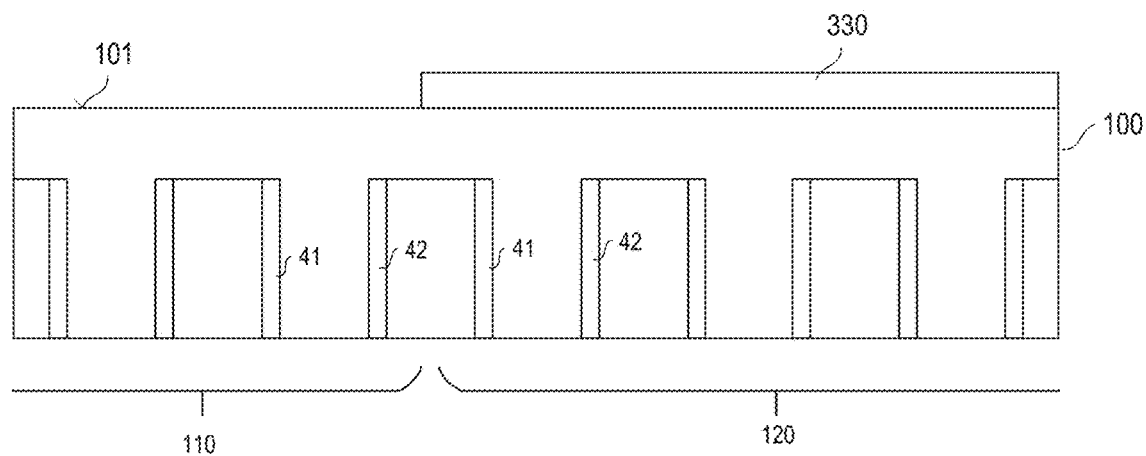
FIGS. 9A to 9B illustrate another example of a method for diffusing first type dopant atoms and second type dopant atoms included in the first and second implanted regions, wherein the method includes forming a vacancy generating layer on the edge region of the semiconductor body and thermal process.
Figure 9B:
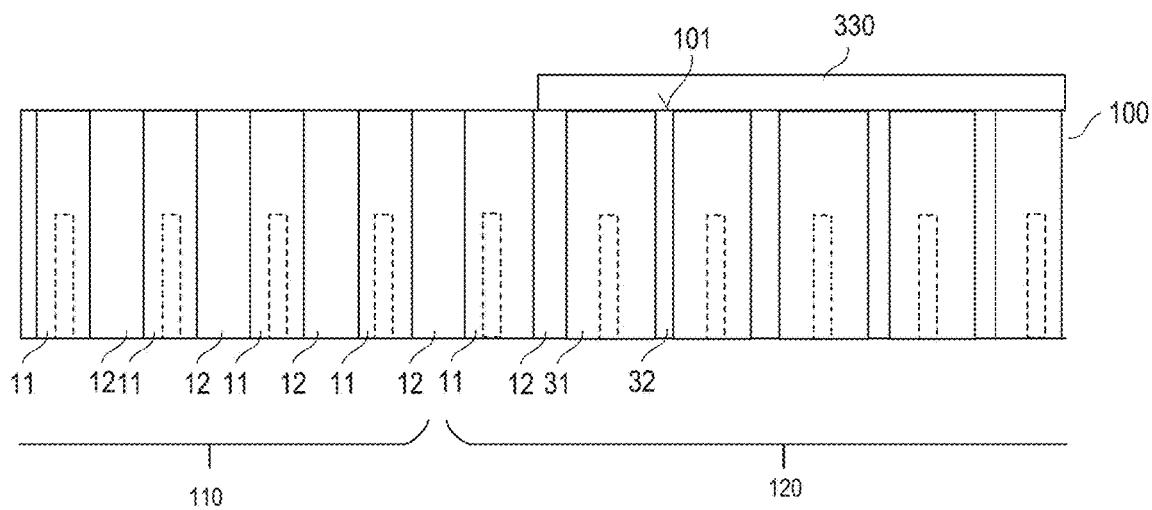

FIG. 9B illustrates the semiconductor body 100 after the thermal activation process. This thermal activation process may take place in an inert atmosphere or in an oxidizing atmosphere (not shown). In this thermal process, dopant atoms in the first and second implanted regions 41, 42 diffuse in the semiconductor body 100. In the inner region 110 a separation process of the first and second type dopant atoms takes place in the way explained above, so that first and second regions 11, 12 are formed. In the edge region 120, promoting the diffusion of first type dopant atoms by the vacancies has the effect that a difference between the diffusion coefficient (the average diffusion length) of the dopant atoms of the second type and dopant atoms of the first type is lower than in the inner region 110. This counteracts the separation effect and has the effect, that in the edge region 120 a lateral doping dose of the resulting first and second regions 31, 32 is lower than a lateral doping dose of the first and second regions 11, 12 in the inner region 110.

Basically, referring to FIGS. 5A-5B and 9A-9B, the separation of the dopant atoms of the first doping type and the second doping type may be reduced in the edge region 120 as compared to the inner region 110 by reducing the diffusion of the faster diffusing dopant atoms in the edge region 120 (see FIGS. 5A-5B) or by promoting the diffusion of the slower diffusing dopant atoms in the edge region 120 (see FIGS. 9A-9B).

Figure 10A:
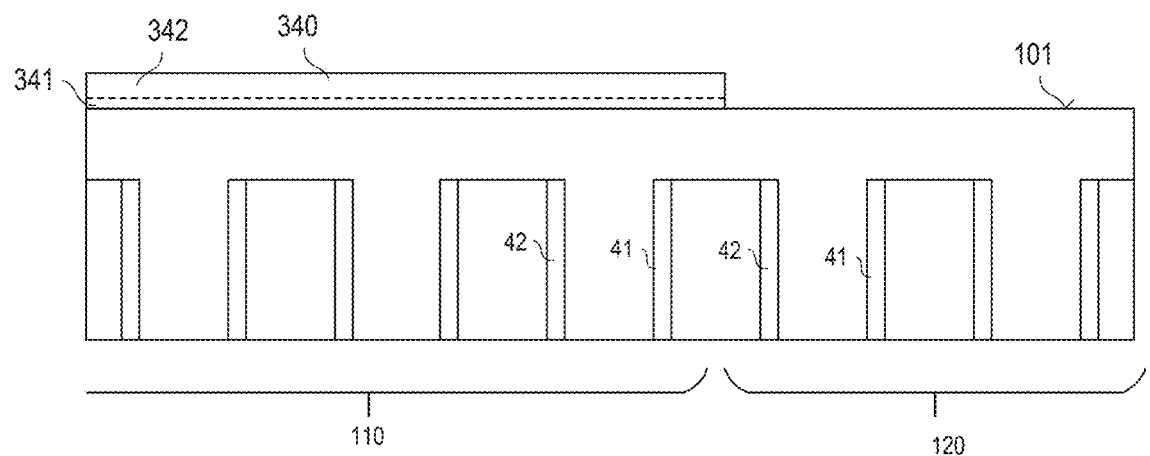
FIGS. 10A to 10B illustrate another example of a method for diffusing first type dopant atoms and second type dopant atoms included in the first and second implanted regions, wherein the method includes forming a protection layer on the inner region of the semiconductor body and an oxidizing thermal process.
Figure 10B:
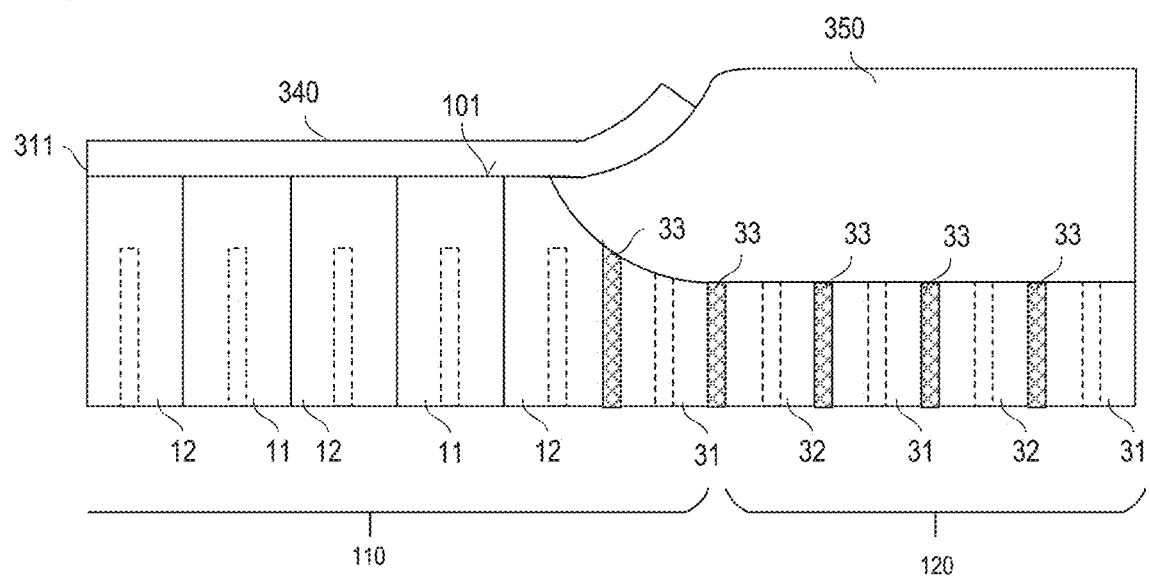

In the examples illustrated in FIGS. 5A-5B and 9A-9B, the first and second implanted regions 41, 42 each include dopant atoms of both the first doping type and the second doping type. FIGS. 10A to 10B illustrate a method according to another example. In this example, each of the first implanted regions 41 only includes dopant atoms of the first doping type and each of the second implanted regions 42 only includes dopant atoms of the second doping type.

Figure 12A:
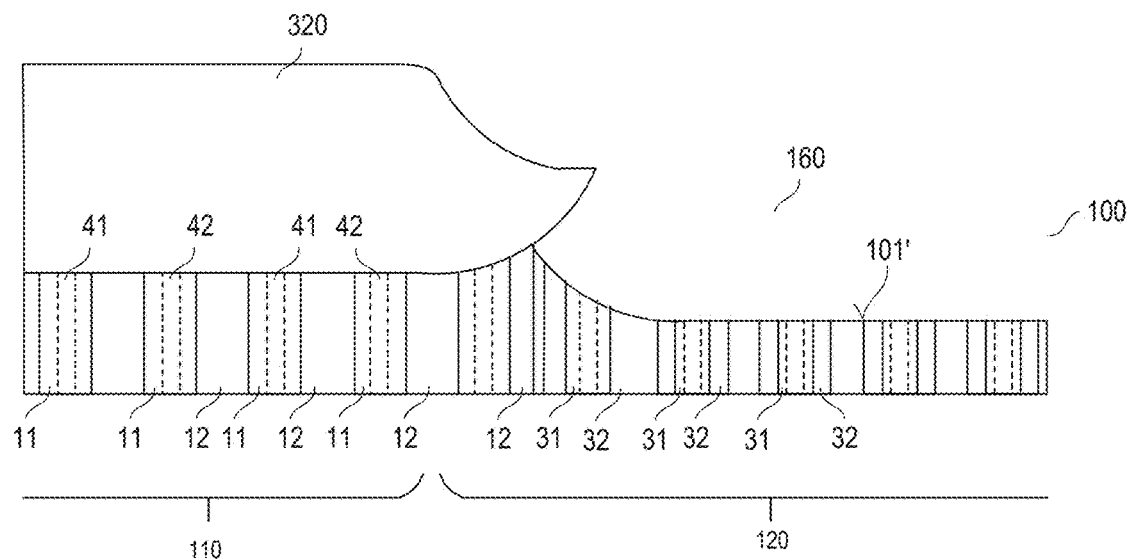
FIGS. 12A and 12B illustrate optional further process steps after the method illustrated in FIGS. 5A to 5B.

Further, referring to FIG. 12A, a protection layer 340 is formed on the first surface 101 in the inner region 110. This protection layer 340 may be formed in the same way as the protection layer 310 illustrated in FIGS. 5A and 5B and may include an oxide layer 341 on top of the surface 101 and a nitride layer 342 on top of the oxide layer 341.

Referring to FIG. 10B, the method further includes a thermal process in an oxidizing atmosphere so that an oxide layer 350 is grown on and in the semiconductor body 100 in the edge region 120. According to one example, a temperature and a duration of this thermal process are selected such that in the inner region 110 first regions 11 are formed from the dopant atoms included in the first implanted regions 41 and second regions 12 are formed from the dopant atoms included in the second implanted regions 42. These first and second regions 11, 12 may adjoin each other (as illustrated) or may be spaced apart from each other (not illustrated).

In the edge region 120, the growth of the oxide layer 350 is associated with an injection of interstitials into the semiconductor body 100. These of at least one of the first doping type and the second doping type. According to one example, the first type and second type dopant atoms are selected such that interstitials promote the diffusion of both types of dopant atoms. In this case, the first type dopant atoms may be phosphorous (P) atoms and the second type dopant atoms may be boron (P) so that in the edge region 120, the first regions 31 and the second regions 32 "overlap", wherein reference number 33 denotes those regions where the first regions 31 and the second regions 32 overlap. This overlap of the first and second regions 31, 32 has the effect that in the edge region 120 a lateral doping dose of the resulting first and second regions 31, 32 is lower than a lateral doping dose of the first and second regions 11, 12 in the inner region 110.

Figure 11A:
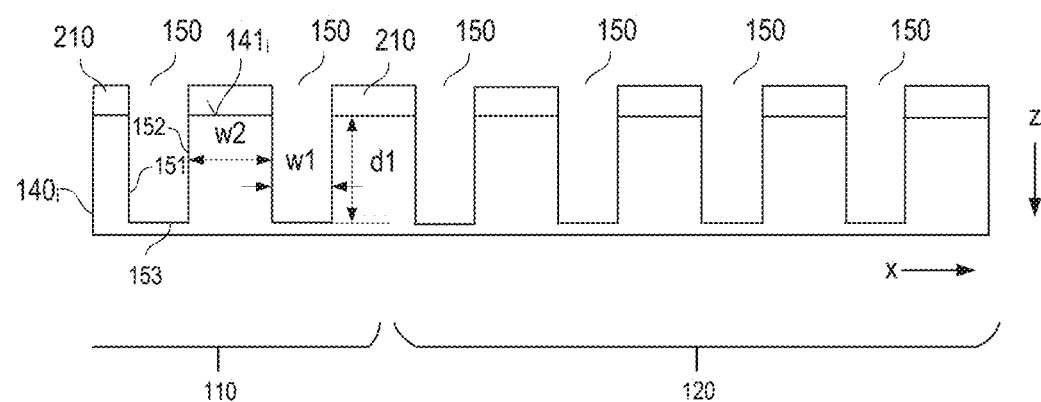
FIGS. 11A and 11B illustrate one example of a method for forming first and second implanted regions in the semiconductor body.
Figure 11B:
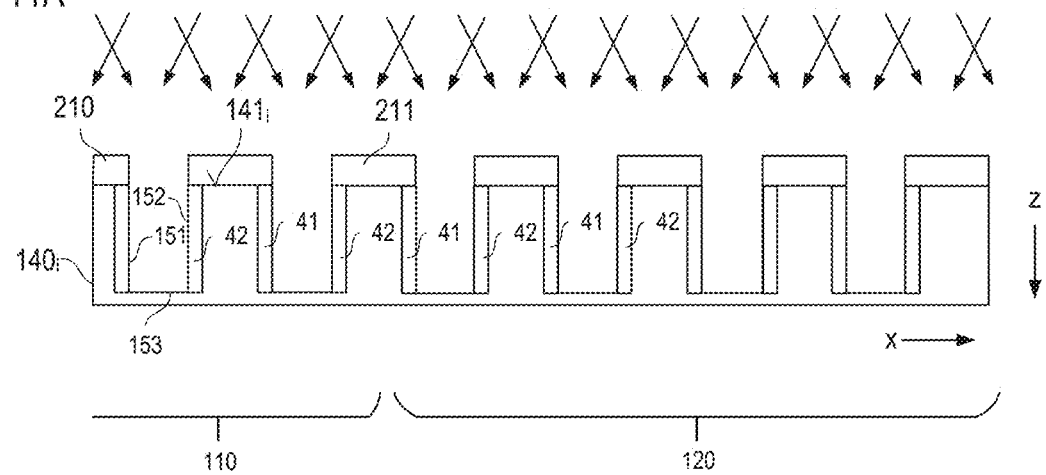

FIGS. 11A-11B illustrate one example of a method for forming the trenches 150 and the first implanted regions 41, and the second implanted regions 42 in one semiconductor layer $140_i$, wherein this semiconductor layer 140 represents an arbitrary one of the semiconductor layers $140_1$-$140_n$ illustrated in FIGS. 3 and 4. Each of FIGS. 11A-11B illustrates a vertical cross-sectional view of the semiconductor layer $140_i$ during different process steps, wherein only the semiconductor layer $140_i$ is illustrated in these figures.

Referring to FIG. 11A, the method includes forming a patterned etch mask 210 on top of a surface $141_i$ of the semiconductor layer $140_i$. The etch mask 210 is patterned such that it includes openings at those positions of the surface $141_i$ where the trenches 150 are to be formed. Patterning the etch mask 210 may include a lithographic process. Referring to FIG. 4A, the method further includes etching the first trenches 150 using the etch mask 210. Etching the first trenches 150 includes an anisotropic etching process, for example.

According to one example, the trenches 150 are formed such that an aspect ratio, which is a ratio between a depth d2 and a width w2 of the trenches 150, is between 1:1 and 5:1, in particular, between 1:1 and 3:1. The "depth d2" of the first trenches 150 is the dimension in the vertical direction z, and the "width w2" of the first trenches 150 is their dimension in the first lateral direction x. A distance w3 between neighboring trenches is between 0.6 times the width w2 and 1.4 times the width w2 of the first trenches 150. A region between two neighboring trenches 150 can be referred to as mesa region, so that the distance between neighboring trenches can also be referred to as width of mesa regions formed between the trenches 150.

Referring to FIG. 11B, the method further includes forming the first implanted regions 41 along the first sidewalls 151 and the second implanted regions 42 along the second sidewalls 152. In the example illustrated in FIG. 11B, forming these implanted 41, 42 regions includes a first implantation process and a second implantation process. In the first implantation process, dopant atoms are implanted into the first sidewalls 151 of the trenches 150 in the inner region 110 and the edge region 120. In the second implantation process, dopant atoms are implanted into the second sidewalls 152 of the trenches 150 in the inner region 110 and the edge region 120.

Referring to FIG. 11B, a protection layer 211 can be formed on top of the mesa regions before the implantation processes, wherein the protection layer 210 prevents dopant atoms from being implanted into top surfaces $141_i$ of the mesa regions of the semiconductor layer $140_i$. According to one example, the protection layer 211 is the etch mask 210 used in the etching process illustrated in FIG. 11A. Optionally, the etch mask 210 is removed before the implantation processes and another type of protection layer is formed on the first surface $141_i$.

Each of the first and second implantation processes is a tilted implantation process in which an implantation direction is inclined relative to the vertical direction z so that dopant atoms are implanted into the first and second sidewalls 151, 152. According to one example, the implantation angle is adjusted such that dopant atoms are implanted into the first and second sidewalls 151, 152, but not into the bottoms 153 of the trenches 150.

The first and second implantation processes can be implemented in various ways, that is, the first and second implanted regions 41, 42 can be formed in various ways:

(a) The semiconductor layer $140_i$ may be formed such that it is intrinsic (that is, has a basic doping concentration lower than 1E14 cm$^{-3}$). Further, dopants of only one of the first and second doping type are implanted into the first sidewalls 151 in the first implantation process, and dopant atoms of only the other one of the first and second doping type are implanted into the second sidewalls 152 in the second implantation process, so that the first and second implanted regions 41, 42 each include dopant atoms of only one of the first and second doping type. If, for example, the first implanted regions 41 only include dopants of the first doping type and the second implanted regions 42 only include dopants of the second doping type, the first implanted regions 41 form the basis of the first regions 11, 31 and the second implanted regions 42 form the basis of the second regions 12, 32.

(b) According to another example, both dopants of the first doping type and dopants of the second doping type are implanted into each of the first and second sidewalls 151, 152 in each of the first and second implantation process, so that each of the first and second implanted regions 41, 42 includes both dopants of the first doping type and dopants of the second doping type. In this case, each of the first and second implanted regions 41, 42 forms the basis of a first region and a second region. Implanting dopant atoms of both the first doping type and the second doping type into respective ones of the first and second sidewalls 151, 152 may include two implantation sub-processes, a first implantation sub-process in which dopants of the first doping type are implanted, and a second implantation sub-process in which dopants of the second doping type are implanted. According to another example, implanting both dopants of the first doping and dopants of the second doping type into respective ones of the first and second sidewalls 151, 152 may include only one implantation process in which dopants of the first doping type and dopants of the second doping type are implanted at the same time, for example, by implanting molecules that include both dopants of the first doping type and dopants of the second doping type in equal shares. According to one example, if dopant atoms of both types are implanted into one sidewall, the dopant atoms may be chosen such that they have different diffusion coefficients. According to one example, the first type dopant atoms are arsenic (As) or antimony (Sb) atoms, and the second type dopant atoms are boron (B) atoms.

According to another example, the semiconductor body 100 is formed such that the at least one semiconductor layer $140_1$-$140_n$ has a basic doping of one of the first doping and the second doping type. In this case, dopant atoms of the other one of the first and second doping type are implanted into at least one of the first and second sidewalls 151, 152. According to one example, the dopant atoms of the other one of the first and second doping type are implanted into each of the first and second sidewalls 151, 152. Forming the at least one semiconductor layer $140_1$-$140_n$ with a basic doping of one of the first doping and the second doping type may include in-situ doping the at least one semiconductor layer $140_1$-$140_n$ in an epitaxial growth process.

In this example, in order to achieve a lateral doping dose of the first and second regions 31, 32 that is lower in the edge region 120 than in the inner 110 the diffusion process may be such that the implanted dopant atoms diffuse faster in the edge region 120 than in the inner region. This is different from the diffusion process in a method in which both types of dopant atoms are implanted into the same sidewall.

According to one example, the implanted dopant atoms are selected such their diffusion is promoted by interstitials. In this case, a thermal oxide layer may be formed on top of the edge region 120 during the thermal diffusion process and a protection layer, such as a nitride layer, may be formed on top of the inner region 110 before the thermal diffusion process. According to one example, the basic doping of the at least one semiconductor layer $140_1$-$140_n$ is an n-type doping, which may be achieved by in-situ doping the at least one semiconductor layer $140_1$-140 with phosphorous (P) atoms and the implanted dopant atoms are p-type dopants such as boron (B) atoms. Referring to the above, the diffusion of boron (B) atoms is increased in the presence of interstitials. Additionally or alternatively to forming an oxide layer, which promotes the injection of interstitials, on top of the edge region a stress layer, which promotes the injection of vacancies, may be formed on top of the inner region 110. These vacancies reduce the diffusion of B atoms, for example.

According to one example, the implanted dopant atoms are selected such their diffusion is promoted by vacancies. Referring to the above, the injection of vacancies can be promoted by a stress layer. Thus, promoting the diffusion of vacancies in the edge region 120 may include forming a stress layer of the type explained above on top of the edge region. According to one example, the basic doping of the at least one semiconductor layer $140_1$-$140_n$ is a p-type doping, which may be achieved by in-situ doping the at least one semiconductor layer $140_1$-140 with boron (B) atoms and the implanted dopant atoms are n-type dopants such as arsenic (As) or antimony (Sb). Referring to the above, the diffusion of As or Sb is increased in the presence of vacancies. Additionally or alternatively to forming a stress layer, which promotes the injection of vacancies, on top of the edge region 120 an oxide layer, which promotes the injection of interstitials, may be formed on top of the inner region 110. These interstitials reduce the diffusion of As or Sb atoms, for example.

Referring to the above, the method may include forming a protection layer 310 or a vacancy inducing layer 330 on the first surface 101 of the semiconductor body 100 above the edge region 120. FIG. 12A illustrates the semiconductor body 100 after removing the protection layer 310 or vacancy inducing layer 330. Removing the protection layer 310 or vacancy inducing layer 330 may include an etching process that uses the oxide layer 320 formed on the first surface 101 as an etch mask. The etching process may be implemented such that it stops once the protection layer 310 or vacancy inducing layer 330 has been removed. Alternatively, as illustrated in FIG. 12A, the etching process continues after the protection layer 310 or vacancy inducing layer 330 has been removed in order to etch the semiconductor 100 in such a way that a recess 160 is formed in the semiconductor body 100 in the edge region 120. Referring to FIG. 12A, forming the recess 160 may include etching the semiconductor 100 such that a bottom surface 101' of the recess 160, in the vertical direction z, is below a vertical position of an interface between the semiconductor body 100 and the oxide layer 320 in the inner region 110.

Figure 12B:
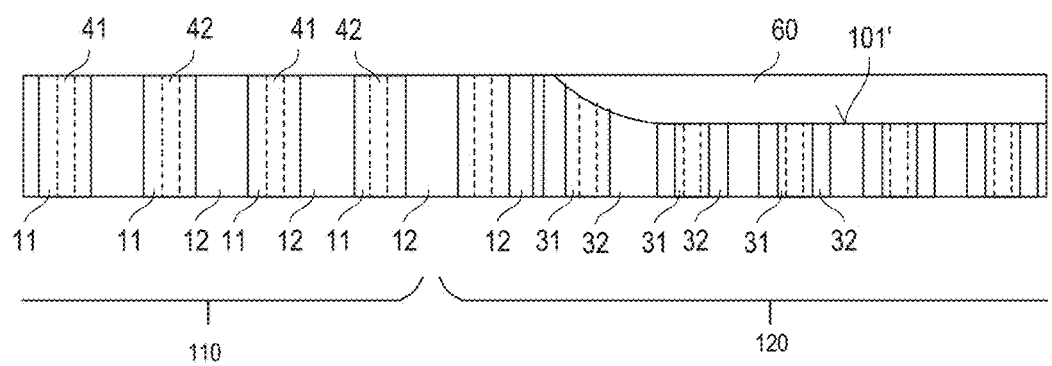

Referring to FIG. 12B, the method may further include removing the oxide layer 320 and filling the recess 160 in edge region with a passivation layer 60 such as an oxide or a nitride, wherein the passivation layer 60 may form a part of an edge termination structure of the finished transistor device. Forming the passivation layer 60 in the recess 160 may include (a) forming a passivation layer all over the surface of the semiconductor body 100 after removing the oxide layer 320, and (b) a planarization process that removes the passivation layer from the surface above the inner region 110.

Figure 13:
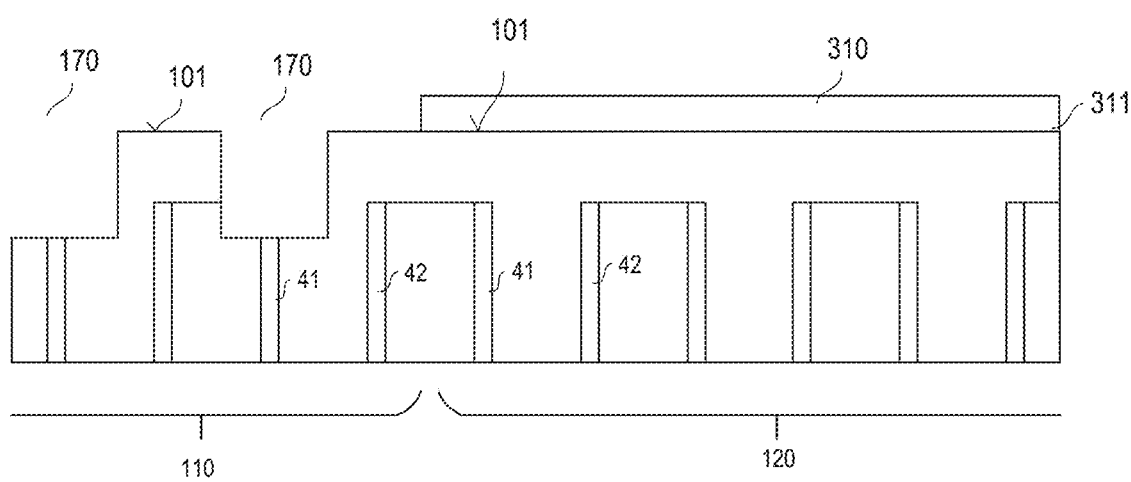
FIG. 13 illustrates a modification of the method shown in FIGS. 5A to 5C.

Referring to the above, the method may include forming an oxide layer 320 on top of the inner region 110 in order to promote an injection of interstitials into the inner region 110 of the semiconductor body 100. Referring to FIG. 13, one or more trenches 170 may be formed in the first surface 101 before the oxidation process that forms the oxide layer 320. These trenches 170 may be formed using a conventional trench etching process. These trenches 170 increase the surface of the semiconductor body 100 so that, after the oxidation process, an interface between the oxide layer 320 and the semiconductor body 100 has a larger area than in a semiconductor body of the same size, but without trenches. This increased area of the interface has the effect that more interstitials are injected as compared to a semiconductor body of the same size, but without trenches.

The trenches 170 may have an arbitrary form and size. These trenches may be removed after removing the oxide layer 320 (not shown in FIG. 13), wherein removing the trenches 170 may include filling the trenches 170, for example, by epitaxially growing a semiconductor layer in the trenches. Alternatively, removing the trenches may include a planarization process.

Figure 14:
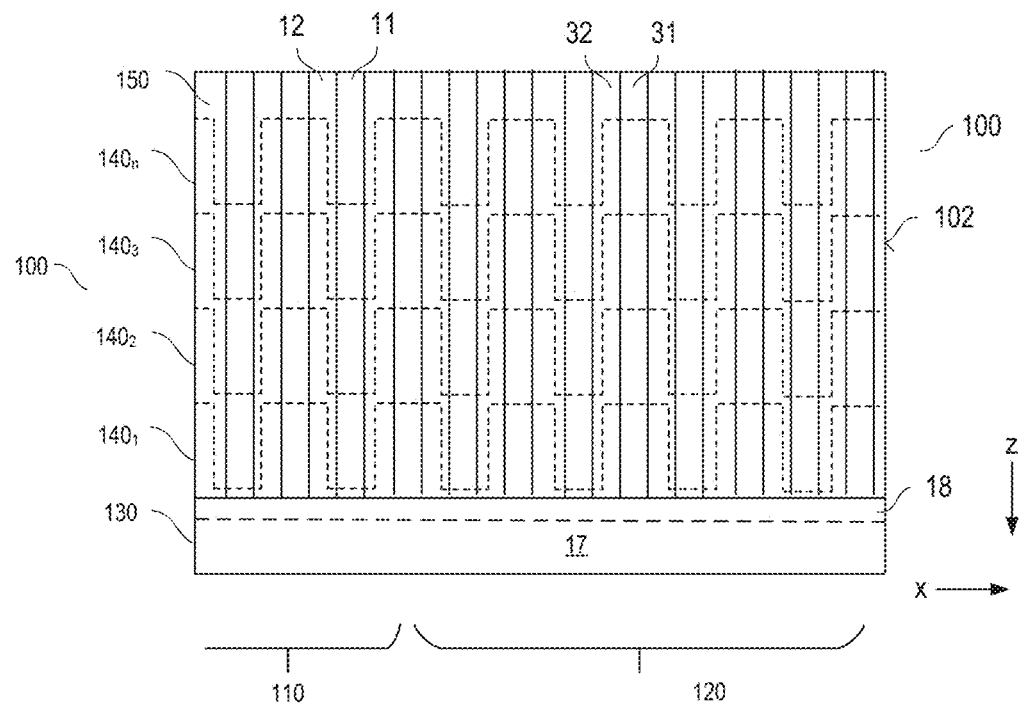
FIGS. 14 and 15 each illustrate one of the arrangements according to FIGS. 3 and 4 after the thermal process.
Figure 15:
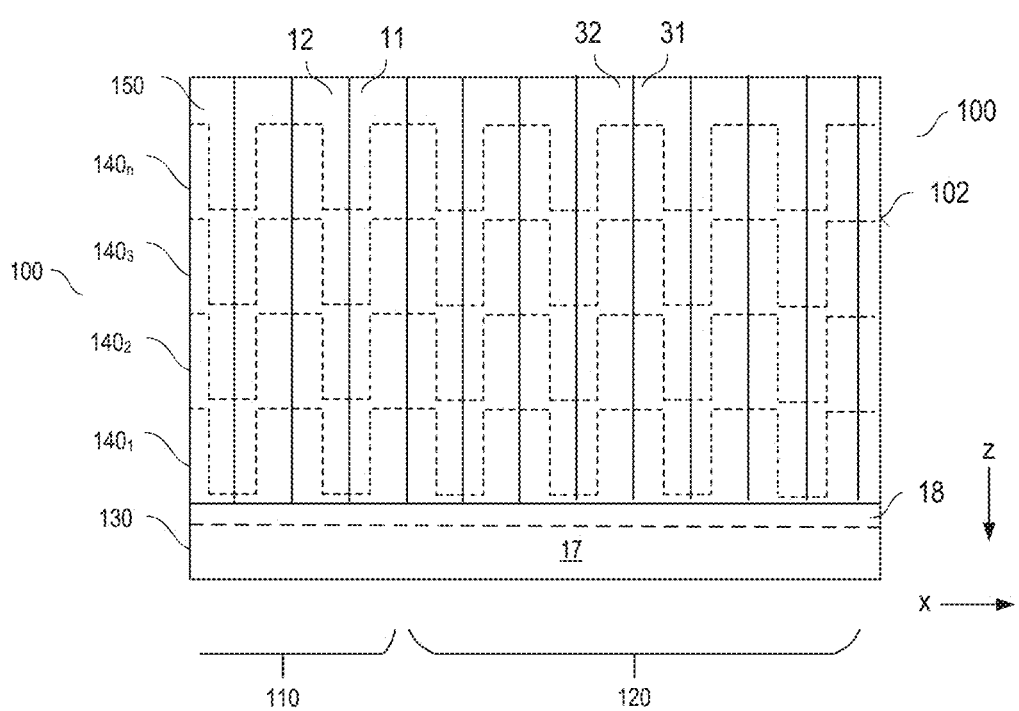

In FIGS. 5B, 9B, and 10B, only an uppermost section of the semiconductor body 100 is illustrated after the thermal process. FIGS. 14 and 15 illustrate a semiconductor body 100 with several semiconductor layers $140_1$-$140_n$ after the thermal process and after removing any oxide layer formed by the thermal process and any protection layer.

FIG. 14 illustrates an example in which the first and second regions 11, 12, 31, 32 result from first and second implanted regions 41, 42, 51, 52 that include dopant atoms of both the first doping type and the second doping type. FIG. 15 illustrates an example in which the first regions 11, 31 result from first implanted regions 41, 51 that include dopant atoms of one of the first and second doping type only and the second regions 12, 32 result from second implanted regions 42, 52 that include dopant atoms of the other one of the first and second doping type only.

Based on a structure according to one of FIGS. 14 and 15, the transistor device is completed by forming the body regions 13 and the source regions 14 in the further semiconductor layer 150, by forming the gate electrode 15 and the gate dielectric 16, and by forming the source electrode 21. Methods for forming these device features are commonly known so that no further explanations are required in this regard.

In the example illustrated in FIGS. 1A to 1B, the transistor cells include a planar gate electrode 14 arranged on top of the surface 101 of the semiconductor body 100. This, however, is only an example. According to another example illustrated in FIG. 16, the transistor cells 10 may be implemented with trench gate electrodes 15 as well. It should be noted that FIG. 16 only illustrates those sections of several transistor cells 10 that include the gate electrodes 15.

Figure 16:
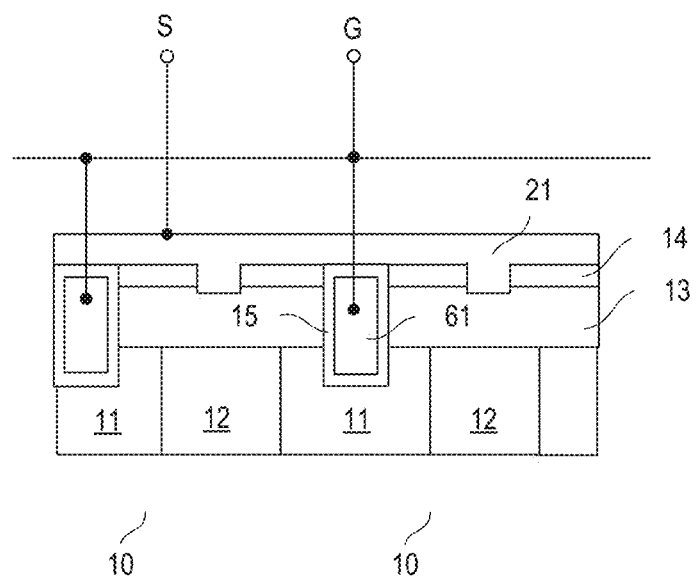
FIG. 16 illustrates vertical cross-sectional views of sections of transistor cells having a trench gate electrode.

Referring to FIG. 13, trenches 170 may be formed in the inner region 110 of the semiconductor body 100 before the thermal process. According to one example, the transistor device is implemented with trench gate electrodes 15 as illustrated in FIG. 16. In this case, the trenches 170 may be implemented such that trenches that remain after removing the oxide layer 320 are those trenches in which the gate dielectrics 16 and gate electrodes 15 are formed.

In a semiconductor device produced in accordance with any of the methods explained above, the effective lateral doping dose of the first regions 31 in the edge region 120 is lower than the effective lateral doping dose of the first regions 11 in the inner region 110, and the effective lateral doping dose of the second regions 32 in the edge region 120 is lower than the effective doping dose of the second regions 12 in the inner region 110. However, dopant atoms of the first and second doping type are introduced into the edge region 120 and the inner region 110 in the same way and with the same dopant doses. Thus, in a first region 11 and an adjoining second region 12 in the inner region 110 and in a first region 31 and an adjoining second region 32 in the edge region 120, the overall amount of first type dopant atoms is essentially the same and the overall amount of second type dopant atoms is essentially the same. "Essentially the same means" that the overall amount of dopant atoms of the first or second type in a first region 11 and an adjoining second region 12 in the inner region 110 deviates less than 20%, less than 10%, or even less than 5% from the overall amount of the respective type of dopant atoms in a first region 31 and an adjoining second region 32 in the edge region 120.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a plurality of first regions of a first doping type and a plurality of second regions of a second doping type in an inner region and an edge region of a semiconductor body; and
   forming body regions and source regions of a plurality of transistor cells in the inner region of the semiconductor body,
   wherein forming the first regions and the second regions comprises:
   forming a plurality of first implanted regions and a plurality of second implanted regions in the inner region and the edge region of the semiconductor body, wherein each of the first implanted regions comprises at least dopant atoms of a first doping type, and wherein each of the second implanted regions comprises at least dopant atoms of a second doping type; and
   diffusing the dopant atoms of the first doping type and the second doping type in a thermal process such that dopant atoms of at least one of the first doping type and the second doping type have at least one of different diffusion rates and diffusion lengths in the inner region and the edge region.

2. The method of claim 1, wherein diffusing the dopant atoms comprises:
   forming a protection layer on a first surface of the semiconductor body in the edge region before the thermal process; and
   performing the thermal process in an oxidizing atmosphere so that an oxide layer is formed on the first surface in the inner region.

3. The method of claim 2, wherein forming the protection layer comprises:
   depositing a nitride layer.

4. The method of claim 2, wherein forming the protection layer comprises:
   depositing an oxide layer.

5. The method of claim 1, wherein diffusing the dopant atoms comprises:
   forming a vacancy generating layer on the first surface of the semiconductor body in the edge region before the thermal process; and
   performing the thermal process in one of an oxidizing and an inert atmosphere.

6. The method of claim 5, wherein forming the vacancy generating layer comprises depositing a nitride layer on the first surface in the edge region.

7. The method of claim 1, wherein each of the first implanted regions and the second implanted regions comprises each of dopant atoms of the first doping type and the second doping type.

8. The method of claim 1, wherein diffusing the dopant atoms comprises:
   forming a protection layer on a first surface of the semiconductor body in the inner region before the thermal process; and
   performing the thermal process in an oxidizing atmosphere so that an oxide layer is formed on the first surface in the edge region and interstitials are inserted into the semiconductor body in the edge region.

9. The method of claim 8, wherein each of the first implanted regions only comprises dopant atoms of the first doping type, and wherein each of the second implanted regions only comprises dopant atoms of the second doping type.

10. The method of claim 1, wherein the dopant atoms of the first doping type comprise at least one of arsenic or antimony atoms, and wherein the dopant atoms of the second doping type comprise boron atoms.

11. The method of claim 1, wherein forming the plurality of first implanted regions and the plurality of second implanted regions comprises:
    forming at least one semiconductor layer;
    forming a plurality of trenches in the inner region and the edge region of the at least one semiconductor layer;
    implanting at least dopant atoms of the first doping type into a first sidewall of each of the plurality of trenches to form the plurality of first implanted regions; and
    implanting at least dopant atoms of the second doping type into a second sidewall of each of the plurality of trenches to form the plurality of second implanted regions.

12. The method of claim 11, wherein forming at least one semiconductor layer comprises forming a plurality of semiconductor layers one on top of the other.

13. The method of claim 11, further comprising:
    forming a further semiconductor layer on top of layer arrangement comprising the at least one semiconductor layer,
    wherein forming the body regions and the source regions of the plurality of transistor cells comprises forming the body regions and the source regions of the plurality of transistor cells in the further semiconductor layer.

* * * * *

UNITED STATES PATENT AND TRADEMARK OFFICE
CERTIFICATE OF CORRECTION

PATENT NO. : 11,348,838 B2
APPLICATION NO. : 16/900329
DATED : May 31, 2022
INVENTOR(S) : H. Weber et al.

It is certified that error appears in the above-identified patent and that said Letters Patent is hereby corrected as shown below:

In the Claims

Column 20, Line 6 (Claim 7), please change "of dopant" to -- of the dopant --.

Column 20, Line 44 (Claim 13), please change "of layer" to -- of the layer --.

Signed and Sealed this
Ninth Day of August, 2022

*Katherine Kelly Vidal*

Katherine Kelly Vidal
*Director of the United States Patent and Trademark Office*